United States Patent
Pavlovic

(10) Patent No.: US 9,496,889 B2
(45) Date of Patent: Nov. 15, 2016

(54) DIRECT SIGMA-DELTA RECEIVER

(71) Applicant: NXP B.V., Eindhoven (NL)

(72) Inventor: Nenad Pavlovic, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/512,923

(22) Filed: Oct. 13, 2014

(65) Prior Publication Data
US 2016/0105196 A1 Apr. 14, 2016

(51) Int. Cl.
*H03M 3/00* (2006.01)
*H03M 1/06* (2006.01)
*H04B 1/00* (2006.01)

(52) U.S. Cl.
CPC ............. *H03M 3/322* (2013.01); *H03M 1/06* (2013.01); *H03M 3/368* (2013.01); *H03M 3/464* (2013.01); *H03M 3/486* (2013.01); *H03M 3/494* (2013.01); *H03M 3/40* (2013.01); *H03M 3/422* (2013.01); *H03M 3/454* (2013.01); *H04B 1/0003* (2013.01)

(58) Field of Classification Search
CPC ........ H03M 1/06; H03M 3/436; H03M 3/30; H03M 3/458; H03M 3/49; H03M 3/322; H03M 3/464; H03M 3/494; H03M 3/454; H03M 3/368; H04B 1/003
See application file for complete search history.

(56) References Cited

U.S. PATENT DOCUMENTS 5,798,664 A * 8/1998 Nagahori ............. H03F 3/087
327/307
6,107,871 A * 8/2000 Shin .................... H03H 19/004
327/552
2009/0202022 A1 * 8/2009 Kaczman ............. H04L 27/3863
375/319
2015/0022386 A1 * 1/2015 Lam ....................... H03M 3/38
341/120

FOREIGN PATENT DOCUMENTS

WO WO-2008/074922 A1 6/2008

OTHER PUBLICATIONS

Koli et al. "A 900-MHz Direct Delta-Sigma Receiver in 65-nm CMOS" IEEE Journal of Solid-State Circuits, vol. 45, No. 12, (Dec. 2010), pp. 2807-2818.*
Wu et al., "A Wideband 400 MHz-to-4 GHz Direct RF-to-Digital Multimode Receiver," in Solid-State Circuits, IEEE Journal of , vol. 49, No. 7, pp. 1639-1652, Jul. 2014.*
Aguirre et al., "Behavioral modeling of continuous-time ΣΔ modulators in matlab/simulink," in Circuits and Systems (LASCAS), 2013 IEEE Fourth Latin American Symposium on , vol., No., pp. 1-4, Feb. 27 2013-Mar. 1, 2013.*

(Continued)

*Primary Examiner* — Chieh M Fan
*Assistant Examiner* — Michelle M Koeth

(57) ABSTRACT

A sigma delta receiver achieves increased stability and noise reduction. The sigma delta receiver includes a first integrator stage, an isolation stage, a second integrator stage, and a quantization stage. The first integrator stage receives an analog radio frequency (RF) signal from an antenna and generates an analog baseband signal based on the analog RF signal. The isolation stage is coupled to an output of the first integrator stage. The isolation stage receives the analog baseband signal from the first integrator stage and amplifies the analog baseband signal. The second integrator stage is coupled to an output of the isolation stage to receive the analog baseband signal. The second integrator stage further amplifies the analog baseband signal. The quantization stage converts the analog baseband signal to a digital signal, and outputs the digital signal.

14 Claims, 4 Drawing Sheets

(56) References Cited

OTHER PUBLICATIONS

Molina-Salgado et al., "LC-Based Bandpass Continuous-Time Sigma-Delta Modulators With Widely Tunable Notch Frequency," in Circuits and Systems I: Regular Papers, IEEE Transactions on , vol. 61, No. 5, pp. 1442-1455, May 2014.*

Koli et al. "A 900-MHz Direct Delta-Sigma Receiver in 65-nm CMOS" I EEE Journal of Solid-State Circuits, vol. 45, No. 12, (Dec. 2010), pp. 2807-2818.*

Wu et al., "A Wideband 400 MHz-to-4 GHz Direct RF-to-Digital Multimode Receiver," in Solid-State Circuits, IEEE Journal of, vol. 49, No. 7, pp. 1639-1652, Jul. 2014.*

Aguirre et al., "Behavioral modeling of continuous-time ~Δ modulators in matlab/simulink," in Circuits and Systems (LASCAS), 2013 IEEE Fourth Latin American Symposium on, vol., No., pp. 1-4, Feb. 27 2013-Mar. 1, 2013.*

Molina-Salgado et al., "LC-Based Bandpass Continuous-Time Sigma-Delta Modulators With Widely Tunable Notch Frequency," in Circuits and Systems I: Regular Papers, IEEE Transactions on, vol. 61, No. 5, pp. 1442-1455, May 2014.*

Lattice Semiconductor Corporation, "Differential Signaling," Application Note AN6019, May 2001,4 pages.*

Sosio et al. "A 2G/3G Cellular Analog Baseband Based on a Filtering ADC" IEEE Transactions on Circuits and Systems—II: Express Briefs, vol. 59, No. 4, (Apr. 2012), pp. 214-218.

Kaczman et al. "A Single-Chip 10-Band WCDMA/HSDPA 4-Band GSM/EDGE SAW-less CMOS Receiver with DigRF 3G Interface and +90 dBm IIP2" IEEE Journal of Solid-State Circuits, vol. 44, No. 3, (Mar. 2009), pp. 718-739.

Pulincherry et al. "Continuous-Time, Frequency Translating, Bandpass Delta-Sigma Modulator" IEEE International Symposium on Circuits and Systems, No. 1, (1999), pp. 1013-1016.

Mirzaei "Analysis and Optimization of Direct-Conversion Receivers with 25% Duty-Cycle Current Driven Passive Mixers" IEEE Transactions on Circuits and Systems I: Regular Papers, vol. 58, No. 10, (Oct. 2011), pp. 2318-2331.

Ghaffari et al. "Tunable High-Q N-Path Band-Pass Filters: Modeling and Verification" IEEE Journal of Solid-State Circuits, vol. 46, No. 5, (2011), pp. 998-1010.

Philips et al. "A 2 mW 89 dB DR Continuous-time Sigma; Delta; ADC with Increased Immunity to Wide-Band Interferers" 2004 IEEE International Solid-State Circuits Conference, Session 4, Oversampled ADCs, No. 4.8 (Feb. 2004), 10 pages.

Straayer et al. "A 10-bit 20 MHz 38mW 950MHz CT SD ADC with a 5-bit Noise-Shaping VCO-Based Quantizer and DEM Circuit in 0.13u cmos" 2007 IEEE Symposium on VLSI Circuits, (2007), pp. 246-247.

Extended European Search Report for Patent Appln. No. 15188783.3 (Apr. 15, 2016).

* cited by examiner

DIRECT SIGMA-DELTA RECEIVER

There is a trend to try to combine radio frequency (RF) and baseband functions as part of an analog-to-digital converter (ADC) block. Some receiver architectures embed the RF front-end into a continuous-time feedback (FB) sigma delta (SD) modulator. The goal is to combine down-mixing, amplification, filtering, and ADC functions in one SD ADC with the purpose of improving overall performance, reducing power dissipation, and reducing chip area.

The baseband part of a receiver chain is generally a cascade of filtering and variable-gain blocks. Filtering blocks lower large interferers to prevent the saturation of the ADC, while gain blocks relax the noise requirements of the ADC when the receiver is operating at the sensitivity level. A challenge with merging receiver functions in the SD ADC is that stability of the loop should not be influenced by extra low pass filtering stages. Furthermore, the signal transfer function (STF), which sets the receiver selectivity, is constrained by the SD topology and the required noise transfer function (NTF). Also, the direct SD receiver should still provide good impedance matching at the RF frequency in order not to amplify nearby blockers.

In one receiver implementation, the first two stages of the SD are implemented as RF integrators. This design is similar to an up-converting SD architecture, but with extra filtering of the quantization noise in the outer feedback digital-to-analog converter (DAC). The up-converted residual quantization noise in the main feedback DAC can still fold back in the signal band after down conversion before the second integrator.

In this implementation, out-of band selectivity is limited as the input signal for the second integrator is taken from the input of the mixer. Thus, the switch resistance of the mixer limits the out-of band selectivity for a given low-noise transconductance amplifier (LNTA) output impedance.

In another receiver implementation, the transconductance ($g_m$) section of the first integrator ($g_m$-C) is implemented at RF. The first integrator is also loaded with a low pass filter section. This topology is similar to other designs, but with a different quantizer.

In this implementation, the low pass filter section is coupled directly to the first integrator, so the gain of the first integrator is reduced. Lower gain in the first integrator increases noise contributions from later stages. An extra low pass section also makes it more difficult to stabilize the SD loop.

Embodiments of a sigma delta receiver achieve increased stability and noise reduction. An embodiment of the sigma delta receiver includes a first integrator stage, an isolation stage, a second integrator stage, and a quantization stage. The first integrator stage receives an analog radio frequency (RF) signal from an antenna and generates an analog baseband signal based on the analog RF signal. The isolation stage is coupled to an output of the first integrator stage. The isolation stage receives the analog baseband signal from the first integrator stage and amplifies the analog baseband signal. The second integrator stage is coupled to an output of the isolation stage to receive the analog baseband signal. The second integrator stage further amplifies the analog baseband signal. The quantization stage converts the analog baseband signal to a digital signal, and outputs the digital signal. Other embodiments of sigma delta receivers are also described.

Embodiments of a radio are also described. In one embodiment, the radio includes an antenna, a sigma delta receiver coupled to the antenna, and a digital signal processor coupled to the sigma delta receiver. The sigma delta receiver includes a first integrator stage, a second integrator stage, and a quantization stage. The first integrator stage processes a radio frequency (RF) signal from the antenna. The second integrator stage processes a baseband signal derived from the RF signal. The quantization stage performs down-conversion of the baseband signal. The digital signal processor processes a digital signal generated from the baseband signal. Other embodiments of radios with sigma delta receivers are also described.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

Figure 1:
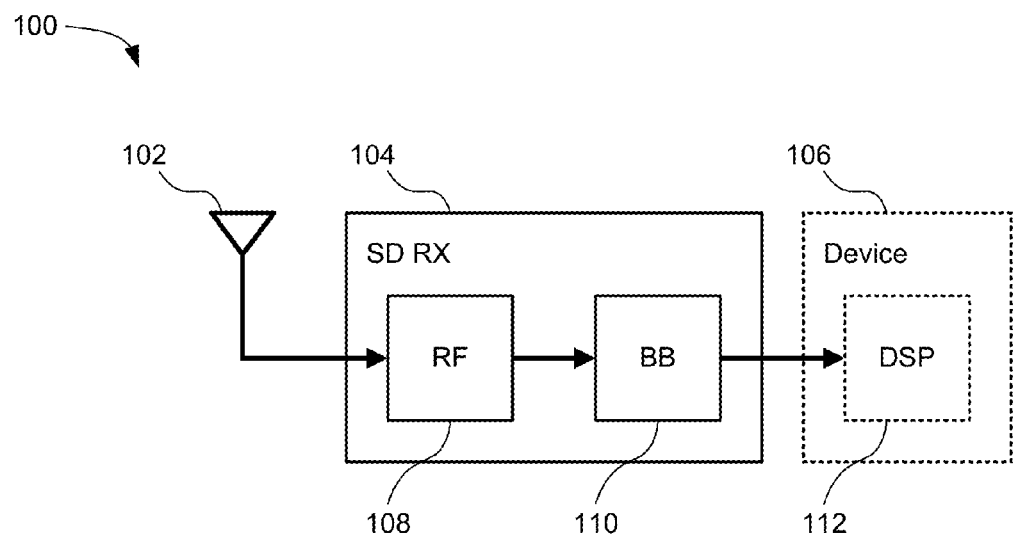
FIG. 1 depicts a schematic block diagram of one embodiment of a radio with a sigma delta receiver.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the described embodiments relate to design and architecture for a sigma delta (SD) receiver (RX). The architecture receives a radio frequency (RF) signal from an antenna and converts it to a baseband signal. Many of the components within the architecture work in the baseband domain. First and second integrators are isolated from one another by an intermediate isolation stage, which may be in the form of a transconductance amplifier. In some embodiments, feedback digital-to-analog (DAC) stages are provided within the second integrator stage to improve stability of the feedback sigma delta architecture. Additionally, some embodiments may incorporate additional resonator stages within the second integrator stage to create a notch in the noise transfer function (NTF) of the sigma delta receiver.

FIG. 1 depicts a schematic block diagram of one embodiment of a radio 100. The depicted radio includes an antenna 102, a sigma delta receiver (SD RX) 104, and a device 106. Although not shown, embodiments of the radio 100 also may include a transmitter. Other embodiments may include additional components and/or functionality.

The antenna 102 may be any type of antenna to receive analog RF signals. The RF signals may originate from another transmitter (not shown) and include signals representative of data or other information. The type of modulation, encoding, or other transmissions parameters that might be employed by the transmitter and the antenna 102 are not limiting to the sigma delta receiver 104.

In general, the sigma delta receiver 104 includes circuitry to process both RF and baseband (BB) signals. The receiver 104 receives the RF signals from the antenna 102 and converts the RF signals to baseband signals. The baseband signals then may be converted into one or more digital signals.

In some embodiments, circuitry within the receiver 104 is arranged in stages, and each stage may perform specific functions. Some stages may be exclusively arranged to process the RF signals, while other stages may be exclusively arranged to process the baseband signals. Still other stages may be arranged to process both RF and baseband signals. In further embodiments, additional signal designations such as intermediate frequency (IF) or other bands of signals may be used within the receiver 104. One schematic example of the receiver 104 is shown in more detail in FIG. 2 and described below.

The device 106 coupled to the receiver 104 may be any type of device that is capable of processing digital signals from the receiver 104. For example, the device 106 may include a baseband processor that implements demodulation functions.

Figure 2:
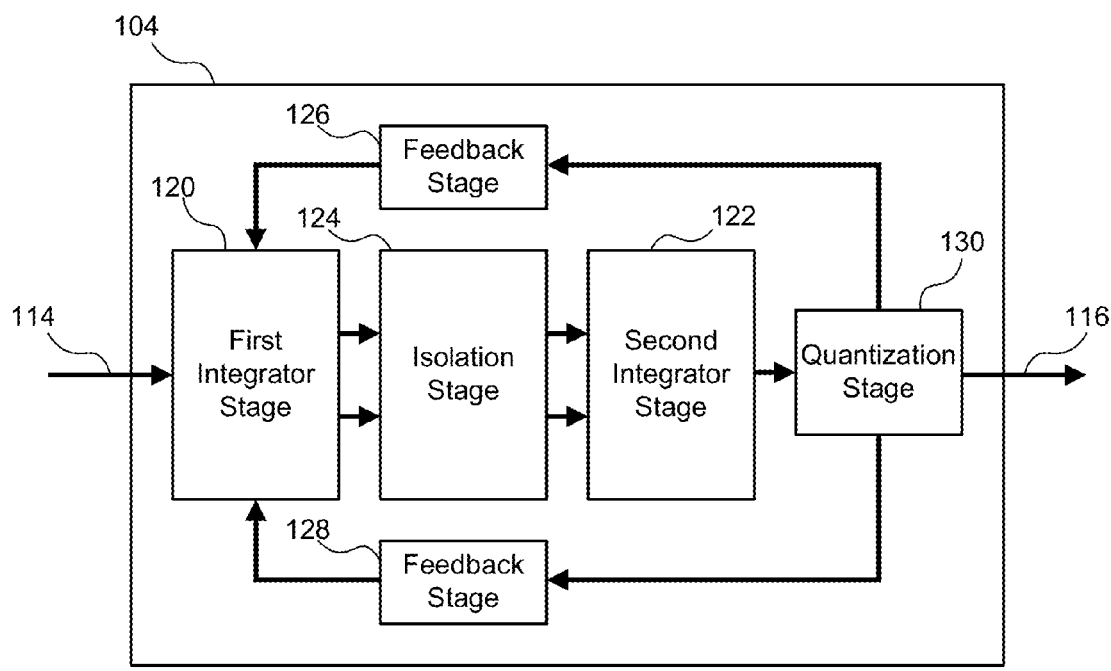
FIG. 2 depicts a schematic block diagram of one embodiment of the sigma delta receiver of FIG. 1.

FIG. 2 depicts a schematic block diagram of one embodiment of the sigma delta receiver 104 of FIG. 1. The illustrated receiver 104 includes an input 114 and an output 116. The input 114 and the output 116 may be used to receive RF signals from the antenna 102 and to send digital signals to the device 106, respectively.

Circuitry within the depicted receiver 104 is arranged in stages. In one embodiment, the receiver 104 includes a first integrator stage 120, a second integrator stage 122, an isolation stage 124, and a quantization stage 130. The depicted receiver 104 also includes feedback stages 126 and 128. Although certain stages are shown in FIG. 2, other embodiments of the receiver 104 may include fewer or more stages.

In one embodiment, the first integrator stage 120 receives the RF signal from the antenna 102. The first integrator stage 120 also converts the RF signal to a baseband signal for use in the subsequent stages of the receiver 104.

In one embodiment, the second integrator stage 122 processes the baseband signal (or some derivation of the baseband signal from the first integrator stage 120). The processing at the second integrator stage includes amplification. The quantization stage 130 performs conversion from the analog domain to the digital domain. As one example, the quantization stage 130 may perform conversion using a one bit quantizer (ADC). The digital signal then can be output from the receiver 104.

In one embodiment, the isolation stage 124 helps to isolate the second integrator stage 122 from conditions of the first integrator stage 120. In some embodiments, when the isolation stage is implemented as transconductance ($g_m$) section with high output impedance, the gain of the second integrator 122 may be improved due to a swing created on the virtual ground of the first integrator 120 (when the gain of the second integrator 122 drops at low frequency offsets).

In one embodiment, the feedback stages 126 and 128 provide feedback from the output of the quantization stage 130 to the first integrator stage 120.

Figure 3:
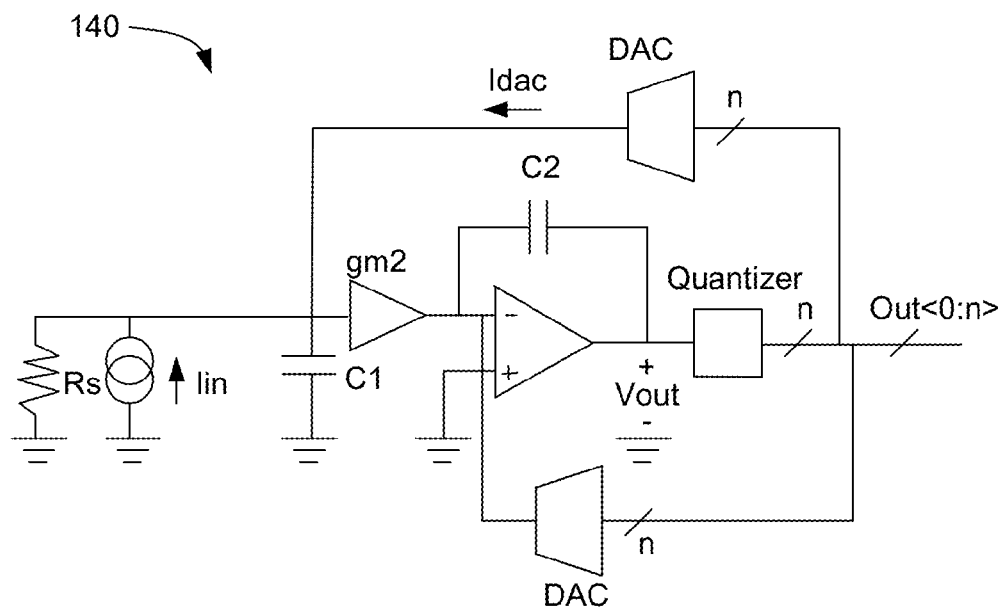
FIG. 3 depicts a schematic circuit diagram of one embodiment of a circuit of the sigma delta receiver of FIG. 2.

FIG. 3 depicts a schematic circuit diagram of one embodiment of a circuit 140 of the sigma delta receiver 104 of FIG. 2. Although the circuit 140 is shown and described with specific components in a specific arrangement, other embodiments of the circuit 140 may include fewer or more components and may be arranged in another manner.

In the depicted embodiment, the first integrator stage is modeled by a resistor Rs, a current source Iin, and a capacitor C1. The isolation stage is implemented by a transconductance amplifier gm2. The second integrator stage includes an amplifier and one or more feedback capacitors C2. The quantization stage includes a quantizer. The feedback DAC takes the digital signal from the output of the quantizer and converts it into an analog signal at the inputs of the amplifier of the second integrator stage. Separate from the feedback DAC used as input at the second integrator stage, the circuit 140 includes an additional feedback stage with a DAC (i.e., the outer DAC) that provides an analog feedback signal to the input of the transconductance amplifier.

In some aspects, embodiments of the circuit 140 are distinguishable from other sigma delta receiver designs because the isolation stage includes the transconductance amplifier, rather than a resistor or other circuit component. As mentioned above, the transconductance amplifier isolates the first integrator stage from the second integrator stage.

In further aspects, embodiments of the circuit 140 are also distinguishable from other sigma delta receiver designs because the second integration stage includes the feedback DAC that provides an analog feedback signal to the amplifier inputs at the beginning of the second integrator stage. By making the feedback DAC present at the input of the second integrator stage, stability of the feedback architecture can be controlled or maintained.

Figure 4:
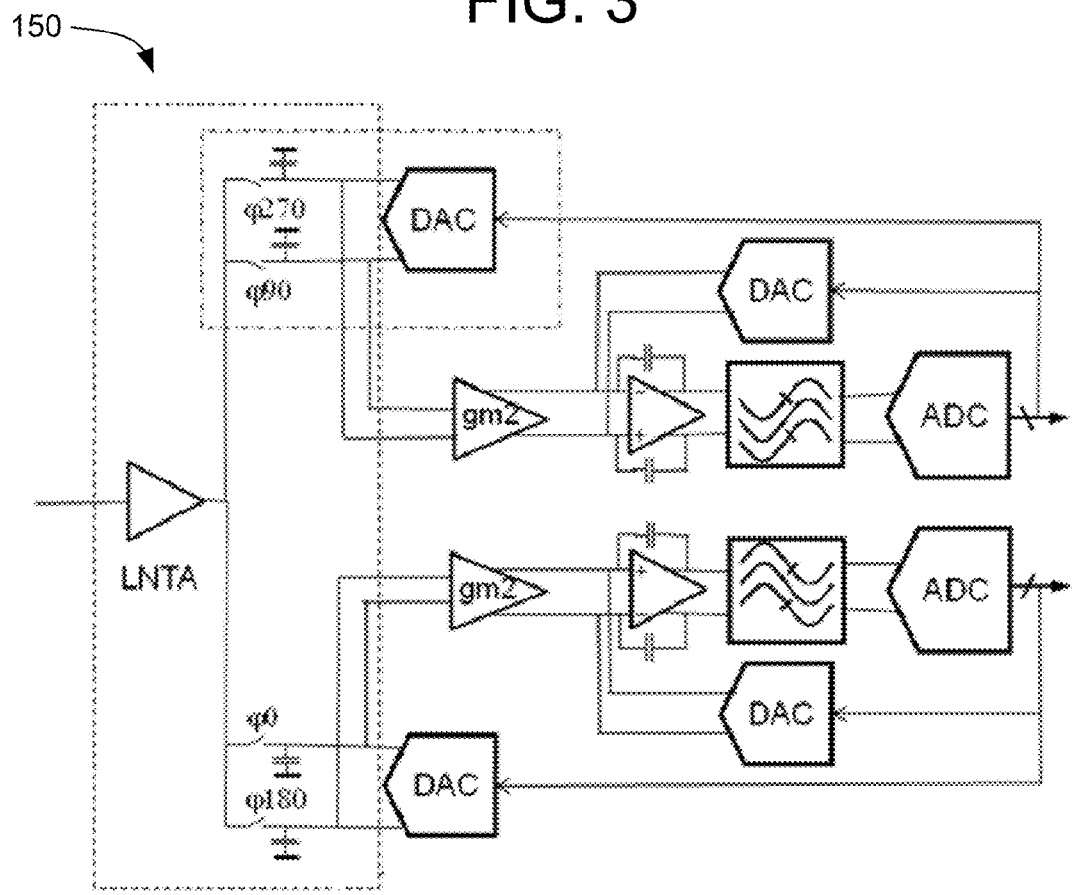
FIG. 4 depicts a schematic circuit diagram of another embodiment of a circuit of the sigma delta receiver of FIG. 2.

FIG. 4 depicts a schematic circuit diagram of another embodiment of a circuit 150 of the sigma delta receiver 104 of FIG. 2. The depicted circuit 150 is similar in some ways to the circuit 140 of FIG. 3. However, the differential nature of the circuit 150 is illustrated more clearly in FIG. 4.

In the illustrated embodiment, the first integrator stage includes a low-noise transimpedance amplifier (LNTA) and a mixer. The mixer is made up of the depicted arrangement of switches and capacitors. The isolation stage includes a pair of transconductance amplifiers, which supply signals to the amplifiers of the second integrator stage. The depicted second integrator stage is followed by extra resonators for filtering, as well as ADCs for converting the analog baseband signals to digital signals. The second integrator stage also includes feedback DACs, similar to the circuit 140 of FIG. 3. Lastly, the circuit 150 of FIG. 4 also includes separate feedback DACs (i.e., outer DACs), similar to the circuit 140 of FIG. 3.

The LNTA portion of the first integrator stage is implemented in the RF domain, while the remaining portions of the circuit 150 operate in the baseband domain. The mixer down-converts the RF signal to baseband. In some embodiments, the mixer is a multi-phase mixer to lower the output impedance seen by the LNTA. Thus, the low-pass baseband impedance is transformed by mixer to low impedance seen at the LNTA output.

Also, as the gain of the first integrator stage is not reduced by loading, the noise performance of embodiments of the receiver 104 may be better compared to other receivers. Also the second order shaping of the quantization noise can be achieved when only two integrators are present in the loop.

In addition to the amplifiers within the second integrator stage, the depicted embodiment includes extra resonators after the second integrator stage. For wide bandwidth sigma delta processing, the quantization noise can be further reduced by using additional resonator stages that will create a notch in the noise transfer function (NTF) of the circuit 150. DAC feedback coefficient(s) for the resonator(s) are not shown.

As mentioned above, the outer feedback loop includes DACs. Because the feedback characteristics of the outer feedback path are weak, the illustrated embodiment results in relatively high impedance at the output of the mixer. To lower the output impedance seen by LNTA, a multiphase mixer is used. The low-pass baseband impedance is transformed by the mixer to low impedance seen at the LNTA output.

As the gain of the first integrator is not reduced by loading, the noise performance of receiver is better compared to other sigma delta implementations. Also the second order shaping of the quantization noise can be achieved when only two integrators are present in the loop. Additionally, due to the extra DACs in the second integrator stage, the unit gain frequency of the second integrator can be increased without compromising stability of the loop. The larger gain of the second integrator lowers the distortion and noise of the following stages of the circuit 150.

Further, at least some embodiments of the sigma delta receiver 104 achieve better out-of-band performance compared to other implementations, as out-of band filtering is not limited by switch resistance. Furthermore, the dynamic range of embodiments of the sigma delta receiver 104 is larger because there is no folding of the quantization noise from the feedback DAC as quantization noise is not up-converted.

Figure 5:
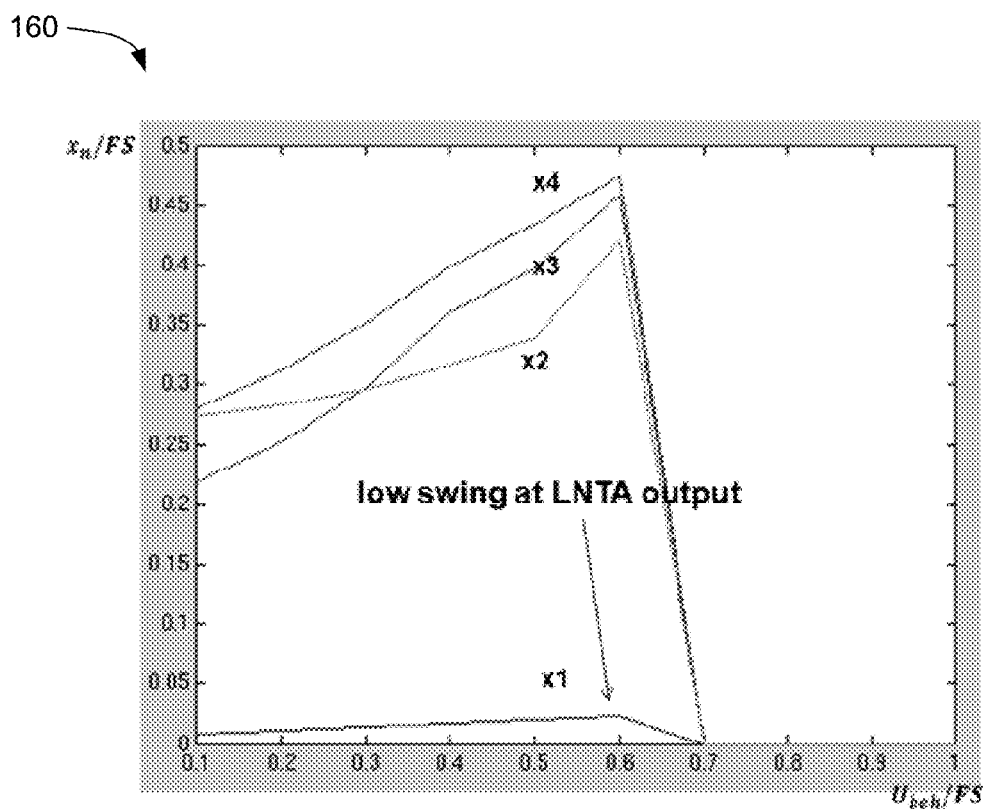
FIG. 5 depicts a signal waveform diagram of one embodiment of integrator outputs normalized to a full scale sigma delta signal.

FIG. 5 depicts a signal waveform diagram 160 of one embodiment of integrator outputs normalized to a full scale sigma delta signal. In a deep submicron CMOS process, the nonlinear output impedance dominates the distortion of the amplifier. In some embodiments, the voltage amplification is postponed until the filtering in the baseband. Additionally, in embodiments, a small voltage gain at the LNTA output is achieved by proper scaling of the integrator states as shown in FIG. 5. The signals x1, x2, x3, and x4 represent the differential voltages at the integrator outputs.

Figure 6:
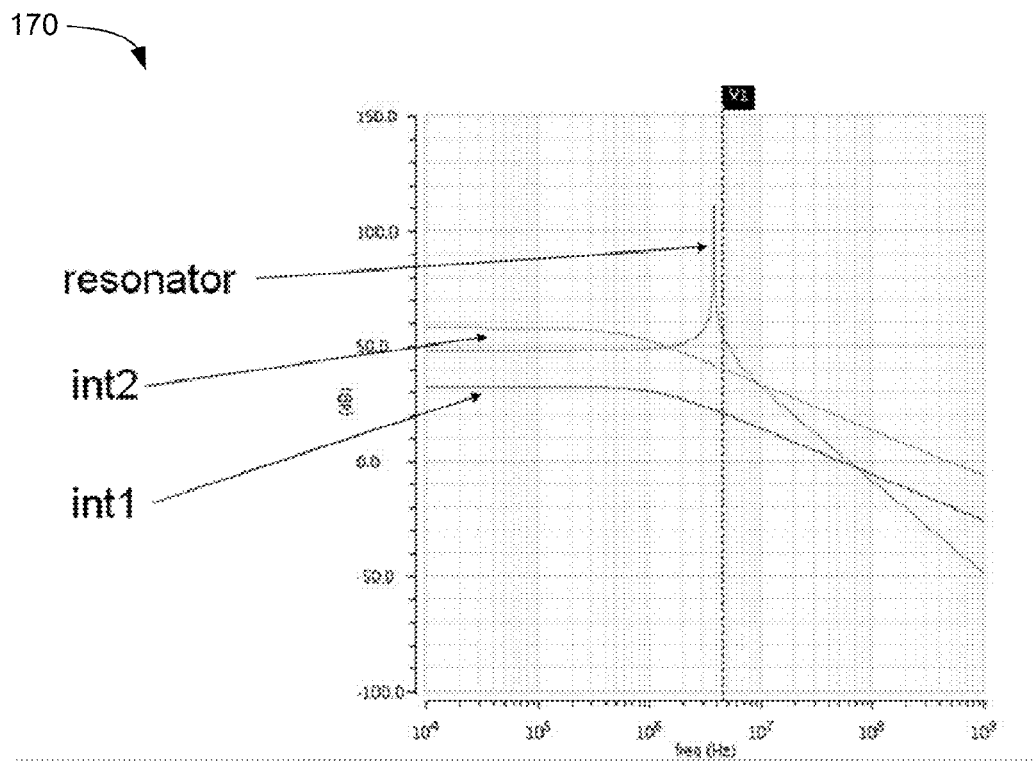
FIG. 6 depicts a signal waveform diagram of one embodiment of open loop gain at an output of the first and second integrator stages.

FIG. 6 depicts a signal waveform diagram 170 of one embodiment of open loop gain at an output of the first and second integrator stages. As illustrated in FIG. 6, the voltage gain occurs at the output of the second integrator. As the feedback is applied at the input of the second integrator, the unit gain frequency of the integrator can be large without influencing stability. In this way, noise and nonlinearity of the resonator are suppressed.

Figure 7:
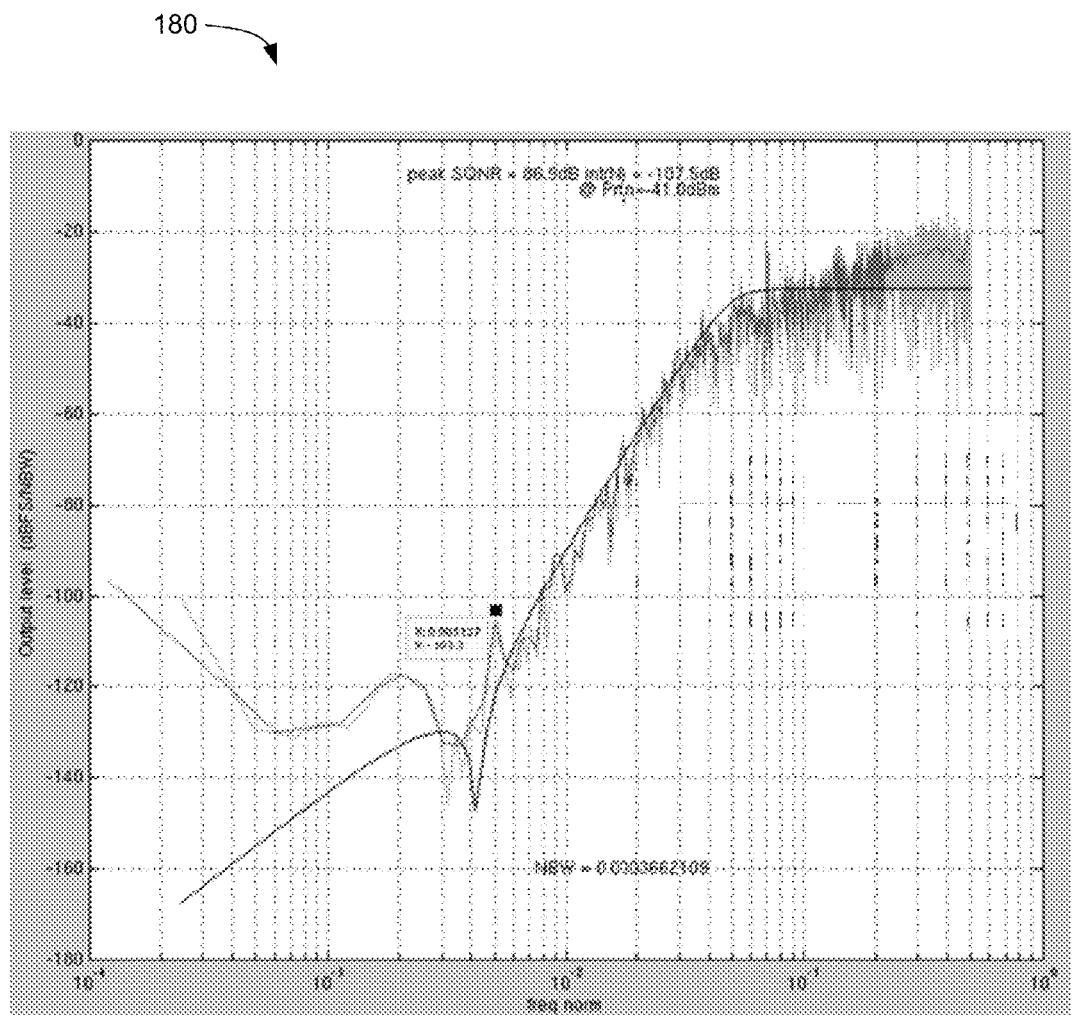
FIG. 7 depicts a signal waveform diagram of one embodiment of a two tone out-of-band intermodulation test.

FIG. 7 depicts a signal waveform diagram 180 of one embodiment of a two tone out-of-band intermediation test. For frequency offsets larger than the signal transfer function (STF) bandwidth of the sigma delta receiver 104, the first integrator filters out-of-band blockers in a passive way. In this way, good out-of-band intermodulation performance can be achieved. For reference, the waveforms in the diagram represent simulation values, averages, and ideals for a particular implementation scenario.

In some embodiments, the current commutating mixer can be implemented as passive mixers driven by 25% duty-cycle clocks.

The direct sigma delta receiver can be used in various applications. For example, some embodiments of the sigma delta receiver can be implemented in BL car radios (WLAN 802.11p (ITS), DAB) when a hostile interference environment asks for a receiver with a high dynamic range (DR) due to out-of band blockers. In another example, embodiments of the sigma delta receiver may be used with multi pipe radio in which the receiver area is lower because a dedicated baseband filter is not needed.

It should also be noted that at least some of the operations for the methods described herein may be implemented using software instructions stored on a computer useable storage medium for execution by a computer. As an example, an embodiment of a computer program product includes a computer useable storage medium to store a computer readable program that, when executed on a computer, causes the computer to perform operations as described herein.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A sigma delta receiver comprising:
   a first integrator stage to receive an analog radio frequency (RF) signal from an antenna and to generate an analog baseband signal based on the analog RF signal;
   an isolation stage coupled to an output of the first integrator stage, the isolation stage to receive the analog baseband signal from the first integrator stage and to amplify the analog baseband signal;
   a second integrator stage coupled to an output of the isolation stage to receive the analog baseband signal, to further amplify the analog baseband signal, wherein the second integrator stage comprises an amplifier and a feedback capacitor that is connected in parallel with the amplifier, wherein the amplifier has a positive input terminal and a negative input terminal, and wherein the positive input terminal is connected to a fixed reference voltage;
   a quantization stage coupled to an output of the second integrator stage to convert the analog baseband signal to a digital signal, and to output the digital signal;
   a first feedback loop from an output of the quantization stage to the negative input terminal of the amplifier of the second integrator stage; and
   a second feedback loop from the output of the quantization stage to an input of a transconductance amplifier of the isolation stage without processing through the first integrator stage.

2. The sigma delta receiver of claim 1, wherein the transconductance amplifier isolates the first integrator stage from the second integrator stage.

3. The sigma delta receiver of claim 1, wherein the first feedback loop comprises a digital-to-analog converter (DAC) to contribute to signal stability within the second integrator stage.

4. The sigma delta receiver of claim 3, wherein the DAC is configured to increase a unit gain frequency of the second integrator stage.

5. The sigma delta receiver of claim 1, wherein the first integrator stage comprises a low-noise transimpedance amplifier (LNTA).

6. The sigma delta receiver of claim 1, wherein the first integrator stage further comprises a mixer to convert the analog RF signal to the analog baseband signal.

7. The sigma delta receiver of claim 1, wherein the second feedback loop comprises a digital-to-analog converter (DAC).

8. The sigma delta receiver of claim 1, wherein the first and second integrator stages are configured to provide second order shaping of a quantization noise.

9. The sigma delta receiver of claim 1, wherein the second integrator stage is cascaded with an integrated resonator.

10. The sigma delta receiver of claim 9, wherein the second integrator stage comprises further resonator stages to create a notch in a noise transfer function (NTF) of the sigma delta receiver.

11. The sigma delta receiver of claim 1, wherein the first integrator stage and the second integrator stage are part of a sigma-delta analog-to-digital converter (ADC).

12. A radio comprising:
   an antenna;
   a sigma delta receiver coupled to the antenna, wherein the sigma delta receiver comprises:
      a first integrator stage to process a radio frequency (RF) signal;
      a second integrator stage to process a baseband signal derived from the RF signal, wherein the second integrator stage comprises an amplifier and a feedback capacitor that is connected in parallel with the amplifier, wherein the amplifier has a positive input terminal and a negative input terminal, and wherein the positive input terminal is connected to a fixed reference voltage;
      a quantization stage to perform down-conversion of the baseband signal;
      an isolation stage coupled between an output of the first integrator stage and an input of the second integrator stage, wherein the isolation stage comprises a transconductance amplifier;
      a first feedback loop from an output of the quantization stage to the negative input terminal of the amplifier of the second integrator stage; and
      a second feedback loop from the output of the quantization stage to an input of the transconductance amplifier of the isolation stage without processing through the first integrator stage; and
   a digital signal processor coupled to the sigma delta receiver to process a digital signal generated from the baseband signal.

13. The radio of claim 12, wherein the first feedback loop comprises a digital-to-analog converter (DAC) to increase a unit gain frequency of the second integrator stage and contribute to signal stability within the second integrator stage.

14. The sigma delta receiver of claim 1, wherein the positive input terminal is directly connected to the ground.

* * * * *